United States Patent
Bäcklund (10) Patent No.: US 9,456,532 B2
(45) Date of Patent: Sep. 27, 2016

(54) RADIO-FREQUENCY POWER GENERATOR CONFIGURED TO REDUCE ELECTROMAGNETIC EMISSIONS

(71) Applicant: GENERAL ELECTRIC COMPANY, Schenectady, NY (US)

(72) Inventor: Andreas Bäcklund, Uppsala (SE)

(73) Assignee: General Electric Company, Schenectady, NY (US)

(*) Notice: Subject to any disclaimer, the term of this patent is extended or adjusted under 35 U.S.C. 154(b) by 167 days.

(21) Appl. No.: 14/575,958

(22) Filed: Dec. 18, 2014

(65) Prior Publication Data

US 2016/0183416 A1 Jun. 23, 2016

(51) Int. Cl.
| | | |
|---|---|---|
| H01J 23/00 | (2006.01) | |
| H05K 9/00 | (2006.01) | |
| H05H 15/00 | (2006.01) | |
| H05H 7/02 | (2006.01) | |

(52) U.S. Cl.
CPC .............. *H05K 9/0009* (2013.01); *H05H 7/02* (2013.01); *H05H 15/00* (2013.01); *H03B 2202/084* (2013.01); *H05H 2007/025* (2013.01)

(58) Field of Classification Search
CPC ............. H05H 1/46; H05H 7/18; H05H 9/04
USPC .............. 315/111.61, 111.21, 500, 505, 506, 315/5.41
See application file for complete search history.

(56) References Cited

U.S. PATENT DOCUMENTS

| | | |
|---|---|---|
| 2,551,715 A | 5/1951 | Young |
| 3,784,911 A | 1/1974 | Ramstrom |
| 6,417,634 B1 | 7/2002 | Bergstrom |
| 6,617,810 B2 * | 9/2003 | Symons .................. H05H 9/00 250/292 |
| 7,339,366 B2 | 3/2008 | Li |

(Continued)

FOREIGN PATENT DOCUMENTS

| | | |
|---|---|---|
| CN | 203289761 U | 11/2013 |
| EP | 0552598 A2 | 7/1993 |

(Continued)

OTHER PUBLICATIONS

Whitaker, Jerry C , Power Vacuum Tubes Handbook 2nd Edition, Chapter 5. "Applying Vacuum Tube Devices" (2000).

(Continued)

*Primary Examiner* — Minh D A
(74) *Attorney, Agent, or Firm* — Dean D. Small; The Small Patent Law Group, LLC.

(57) ABSTRACT

Radio frequency (RF) power generator including an outer enclosure having a system cavity. The outer enclosure separates the system cavity from an exterior of the RF power generator. The outer enclosure is configured to reduce leakage of the electromagnetic radiation into the exterior. The RF power generator also includes a feedthrough assembly comprising a coaxial line configured to receive electric power generated by an RF amplification system. The coaxial line is positioned within the system cavity and has inner and outer conductors. The feedthrough assembly includes a connector shield that forms a feedthrough to the exterior of the RF power generator. The connector shield is electrically coupled to the outer conductor of the coaxial line and integrated with the outer enclosure to reduce leakage of electromagnetic radiation into the exterior.

20 Claims, 8 Drawing Sheets

(56) References Cited

U.S. PATENT DOCUMENTS

| | | |
|---|---|---|
| 7,982,561 B2 | 7/2011 | Mendenhall |
| 8,106,370 B2 | 1/2012 | Norling et al. |
| 8,106,570 B2 | 1/2012 | Norling et al. |
| 8,153,997 B2 | 4/2012 | Norling et al. |
| 8,169,277 B2 | 5/2012 | McIntyre et al. |
| 8,653,762 B2 | 2/2014 | Eriksson et al. |
| 8,823,291 B2 * | 9/2014 | Abs .................... H05H 7/02 315/500 |

FOREIGN PATENT DOCUMENTS

| | | |
|---|---|---|
| JP | H11307984 A | 11/1999 |
| WO | 2012041540 A1 | 4/2012 |

OTHER PUBLICATIONS

Tube Amplification Unit (TAU) of General Electric MINITrace, Part No. 907630 (1999).

Kurkin G.Y., "Other RF Power Sources," In Frontiers of Accelerator Technology (1999).

MINITrace Qilin: Service Manual, Revision 14 (2014), pp. 1-16 and 217-223.

MINITrace Qilin: Service Manual, Revision 14 (2014), pp. 361-363 and 423-429.

International Search Report and Written Opinion from Corresponding PCT application No. PCT/US2015/053110 dated Sep. 30, 2015; 16 pages.

\* cited by examiner

FIG. 11

RADIO-FREQUENCY POWER GENERATOR CONFIGURED TO REDUCE ELECTROMAGNETIC EMISSIONS

CROSS-REFERENCE TO RELATED APPLICATIONS

The subject matter set forth herein is similar to subject matter described in U.S. application Ser. Nos. 14/575,885; 14/575,914; and 14/575,993, which are filed on the same day as the present application. Each of the above applications is incorporated herein by reference in its entirety.

BACKGROUND

The subject matter herein relates generally to radio-frequency (RF) power generators and, more particularly, to mechanisms and methods for reducing electromagnetic radiation leakage.

Radioisotopes (also called radionuclides) have several applications in medical therapy, imaging, and research, as well as other applications that are not medically related. Systems that produce radioisotopes typically include a particle accelerator, such as a cyclotron, that accelerates a beam of charged particles (e.g., H⁻ ions) and directs the beam into a target material to generate the isotopes. The cyclotron includes a particle source that provides the particles to a central region of an acceleration chamber. The cyclotron uses electrical and magnetic fields to accelerate and guide the particles along a predetermined orbit within the acceleration chamber. The magnetic fields are provided by electromagnets and a magnet yoke that surrounds the acceleration chamber. The electrical fields are generated by a pair of radio frequency (RF) electrodes (or dees) that are located within the acceleration chamber. The RF electrodes are electrically coupled to an RF power generator that may include, for example, oscillators, amplifiers, control circuitry, and power supplies. The RF power generator energizes the RF electrodes to provide the electrical field. The electrical and magnetic fields within the acceleration chamber cause the particles to take a spiral-like orbit that has an increasing radius. When the particles reach an outer portion of the orbit, the particles are directed toward the target material for radioisotope production. In addition to controlling the orbit of the particles, the RF electrodes may be used to pull the particles from a particle source in the acceleration chamber.

To operate the RF electrodes within the acceleration chamber, a considerable amount of electric power (e.g., 5 kilowatts to 2 megawatts) is generated by the RF power generator. The RF power generator includes, among other things, an enclosure having a RF amplification system that includes a power electron vacuum tube. The power electron vacuum tube may be, for example, a triode, tetrode, or pentode. The RF amplification system may include a pair of resonators that each have an inner conductor and an outer conductor.

The various electrical devices and sub-systems of the RF power generator produce electromagnetic radiation (or emissions). The resonators, in particular, may generate a significant amount of radiation. Regulations and/or customer demands exist that may require the RF power generator to be electromagnetically compatible such that the RF power generator is able to reliably operate in its intended environment without leaking unwanted electromagnetic radiation that can be harmful to other electrical components. It can be challenging, however, to design RF power generators that are able to reduce the amount of electromagnetic radiation to an acceptable level. For example, RF power generators typically have a number of openings, such as passages or feedthroughs (e.g., for receiving electrical cables or water hoses), vents (e.g., for air intake or exhaust), or holes for receiving hardware (e.g., screws). These openings may allow unwanted electromagnetic radiation to leak into the exterior or into compartments where other electrical components are operating.

RF power generators often include a directional coupler that measures forward and reflected power along the coaxial line. The forward and reflected power may be monitored to control performance of the RF power generator. The directional couplers are typically positioned outside of an enclosure of the RF power generator that surrounds the resonators. The directional couplers may also produce unwanted electromagnetic radiation. In one known system, the directional coupler is positioned within the enclosure. Although the directional coupler is effective in monitoring the forward and reflected power along the coaxial line, the directional coupler is a complex assembly having several, large interconnected parts, elongated seams, and screws. Such assemblies may permit the electromagnetic radiation to leak into the exterior.

BRIEF DESCRIPTION

In an embodiment, a radio frequency (RF) power generator is provided that includes an outer enclosure having a system cavity. The outer enclosure separates the system cavity from an exterior of the RF power generator. The RF power generator also includes an RF amplification system that is disposed in the system cavity and configured to produce electric power for energizing a particle accelerator. The RF amplification system produces electromagnetic radiation within the system cavity. The outer enclosure is configured to reduce leakage of the electromagnetic radiation into the exterior. The RF power generator also includes a feedthrough assembly comprising a coaxial line configured to receive the electric power generated by the RF amplification system. The coaxial line is positioned within the system cavity and has inner and outer conductors. The feedthrough assembly includes a connector shield that forms a feedthrough to the exterior of the RF power generator. The connector shield is electrically coupled to the outer conductor of the coaxial line and integrated with the outer enclosure to reduce leakage of the electromagnetic radiation into the exterior.

In an embodiment, a radio frequency (RF) power generator is provided that includes an outer enclosure having a system cavity. The outer enclosure separates the system cavity from an exterior of the RF power generator. The RF power generator also includes an RF amplification system that is disposed in the system cavity and configured to produce electric power for energizing a particle accelerator. The RF amplification system produces electromagnetic radiation within the system cavity. The outer enclosure is configured to reduce leakage of the electromagnetic radiation into the exterior. The RF power generator also includes an inner enclosure that is positioned within the system cavity. The system cavity includes an outer space that exists between the inner and outer enclosures. The inner enclosure includes interior walls that form a plurality of compartments having respective access openings that open to the outer space. The inner enclosure includes a movable access panel that is configured to engage the interior walls and cover the access openings. The RF amplification system is located within at least one of the compartments. The inner enclosure is configured to reduce leakage of the electromagnetic radiation into the outer space and the exterior.

In an embodiment, a radio frequency (RF) power generator is provided that includes an outer enclosure having a system cavity. The outer enclosure separates the system cavity from an exterior of the RF power generator. The RF power generator also includes an RF amplification system that is disposed in the system cavity and configured to produce electric power for energizing a particle accelerator. The RF amplification system produces electromagnetic radiation within the system cavity. The outer enclosure is configured to reduce leakage of the electromagnetic radiation into the exterior. The RF power generator also including a plurality of interior walls positioned within the system cavity forming a power compartment and a port compartment. The electric power is produced within the power compartment. The port compartment includes an inner conductor therein that receives the electric power. An outer conductor is at least partially formed by at least one of the interior walls. The RF power generator also including pickup elements positioned adjacent to the inner conductor within the port compartment, wherein the inner conductor, the outer conductor, and the pickup elements form a directional coupler disposed within the system cavity of the outer enclosure that measures forward and reflected power.

DETAILED DESCRIPTION

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated, such as by stating "only a single" element or step. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Embodiments set forth herein include radio-frequency (RF) power generators that include an RF amplification system that generate a substantial amount of electric power, such as for energizing a particle accelerator. In particular embodiments, the RF amplification system includes a power tube and at least one resonator coupled to the power tube. However, embodiments may include other types of RF amplification systems. In some embodiments, the RF power generator includes an outer enclosure and an inner enclosure that is located within the outer enclosure. The inner and outer enclosure may form an outer space therebetween that is within the outer enclosure. The outer space may have certain electrical systems or devices disposed therein. The inner enclosure may house certain electrical system or devices, such as the RF amplification system. Thus, the RF amplification system may be surrounded by an inner enclosure and also an outer enclosure.

In some embodiments, the RF power generator includes an outer enclosure having a passage that allows a power cable to couple to the RF amplification system. The RF power generator may include a connector shield that is integrated with the outer enclosure. For example, the connector shield may be welded to the outer enclosure. In other embodiments, the connector shield is formed with the outer enclosure such that a unitary body includes both an exterior of the RF power generator and a connector shield that interconnects the power cable and the internal RF amplification system.

In some embodiments, the RF power generator includes an outer enclosure that houses the RF amplification system and a coaxial line that receives the electric power from the RF amplification system. The RF power generator may include a direction coupler that couples to the coaxial line within the outer enclosure. The directional coupler is configured to measure forward and reflected power along the coaxial line. Unlike conventional systems, the directional coupler is located within the outer enclosure. In such embodiments, the outer enclosure may reduce leakage of electromagnetic radiation that is generated by the directional coupler.

Certain embodiments may include input and output resonators that may be, for example, coaxial transmission line resonators that each include an inner conductor and an outer conductor. The input and output resonators may be characterized as high-Q resonators that are configured to operate at a designated frequency, such as within the very high frequency (VHF) band or higher. As one example, the designated frequency may be 100 MHz. The input and output resonators may be ¼ wavelength resonators (or λ/4 resonators). Although the RF power generator and the RF amplification system described herein is used to supply power to a particle accelerator, it should be understood that the RF power generator and the RF amplification system may be used in other applications. In particular embodiments, the RF power generator or RF amplification system is a high power system that is capable of generating, for example, 1,000 W or more and 500 V or more.

A technical effect provided by one or more embodiments may include a reduction in electromagnetic radiation that is leaked into the exterior (or external environment). Acceptable levels of electromagnetic radiation may be determined by regulations, guidelines, and/or industry standards. As one example, embodiments may provide RF power generators in which electromagnetic radiation does not exceed 10 nanowatts within one (1) meter (m) of the outer enclosure. In particular embodiments, the electromagnetic radiation may not exceed 10 nanowatts within fifty (50) centimeters (cm) or, more particularly, within ten (10) centimeters (cm). Another technical effect provided by one or more embodiments may include a reduction in electromagnetic radiation that is leaked from one compartment to an adjacent or otherwise proximate compartment. The amount of permitted electromagnetic radiation in certain compartments may vary depending upon application.

Embodiments set forth herein may be configured to be electromagnetically compatible such that the embodiments control or limit an amount of unwanted electromagnetic radiation leakage. Embodiments may be configured to satisfy one or more regulations, guidelines, or standards that are established by a governmental body or commercial industry regarding electromagnetic compatibility (EMC) emissions. For example, embodiments set forth herein may be configured to satisfy regulations established by the United States Federal Communications Commission (FCC) (e.g., the Code of Federal Regulations (CFR) section 47 Parts 15, 18, and 68); standards established by the United States military (e.g., MIL-STD-461E, MIL-STD-464, and the like). Other standards include those established by the International Special Committee on Radio Interference (CISPR). Certain embodiments may be configured to satisfy the CISPR 11 and/or the European standard EN 55011:2009. By way of one example, embodiments may be configured to generate at most 100 μV/m at 10 m distance from an outer surface of the enclosure.

Figure 1:
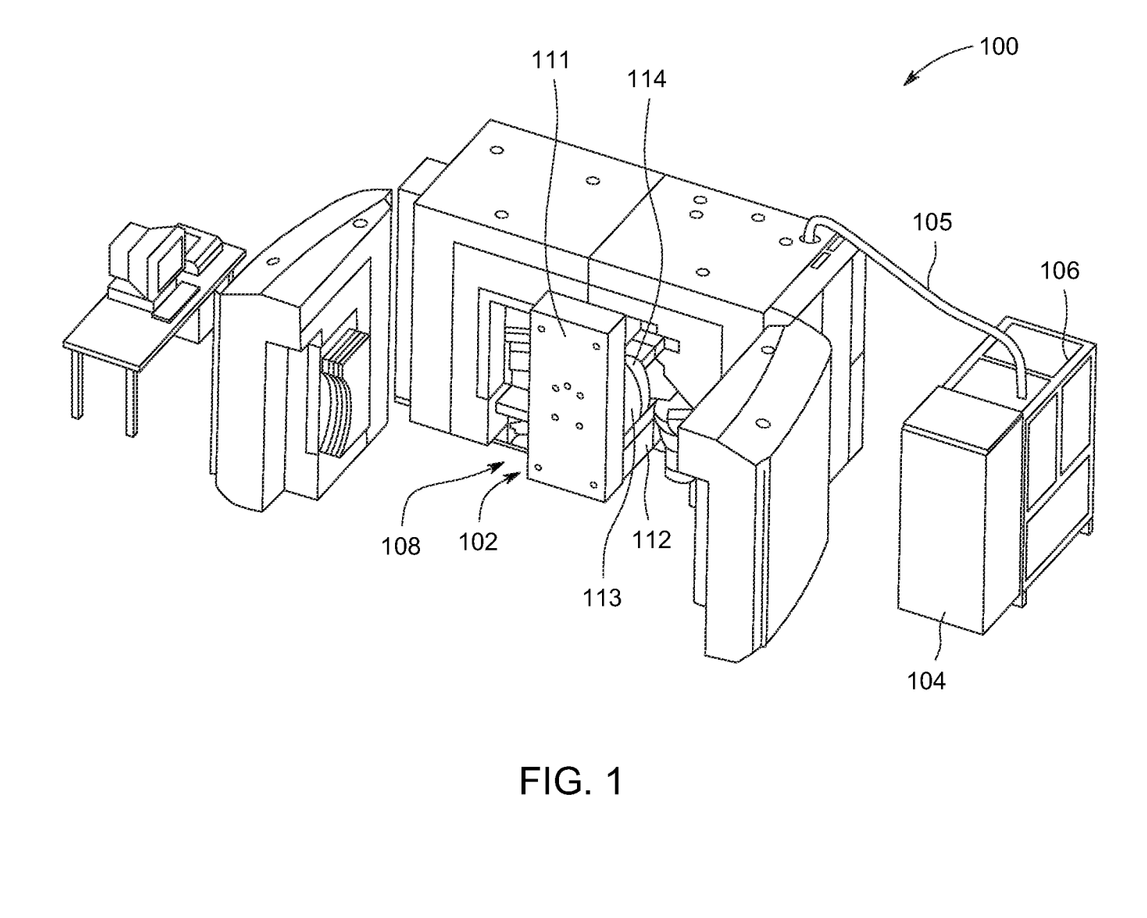
FIG. 1 is a perspective view of an isotope production system in accordance with an embodiment.

FIG. 1 is a perspective view of an isotope production system 100 in accordance with an embodiment. The isotope production system 100 includes a particle accelerator 102 that is operably coupled to a control cabinet 104 and a RF power generator 106. In the illustrated embodiment, the particle accelerator 102 is an isochronous cyclotron, but other types of particle accelerators may be used. RF energy or power is supplied to the particle accelerator 102 through a power cable 105. As shown, the particle accelerator 102 includes a magnet assembly 108 that includes yoke sections 111, 112 and electromagnets 113, 114 that are coupled to the yoke sections 111, 112, respectively.

Figure 2:
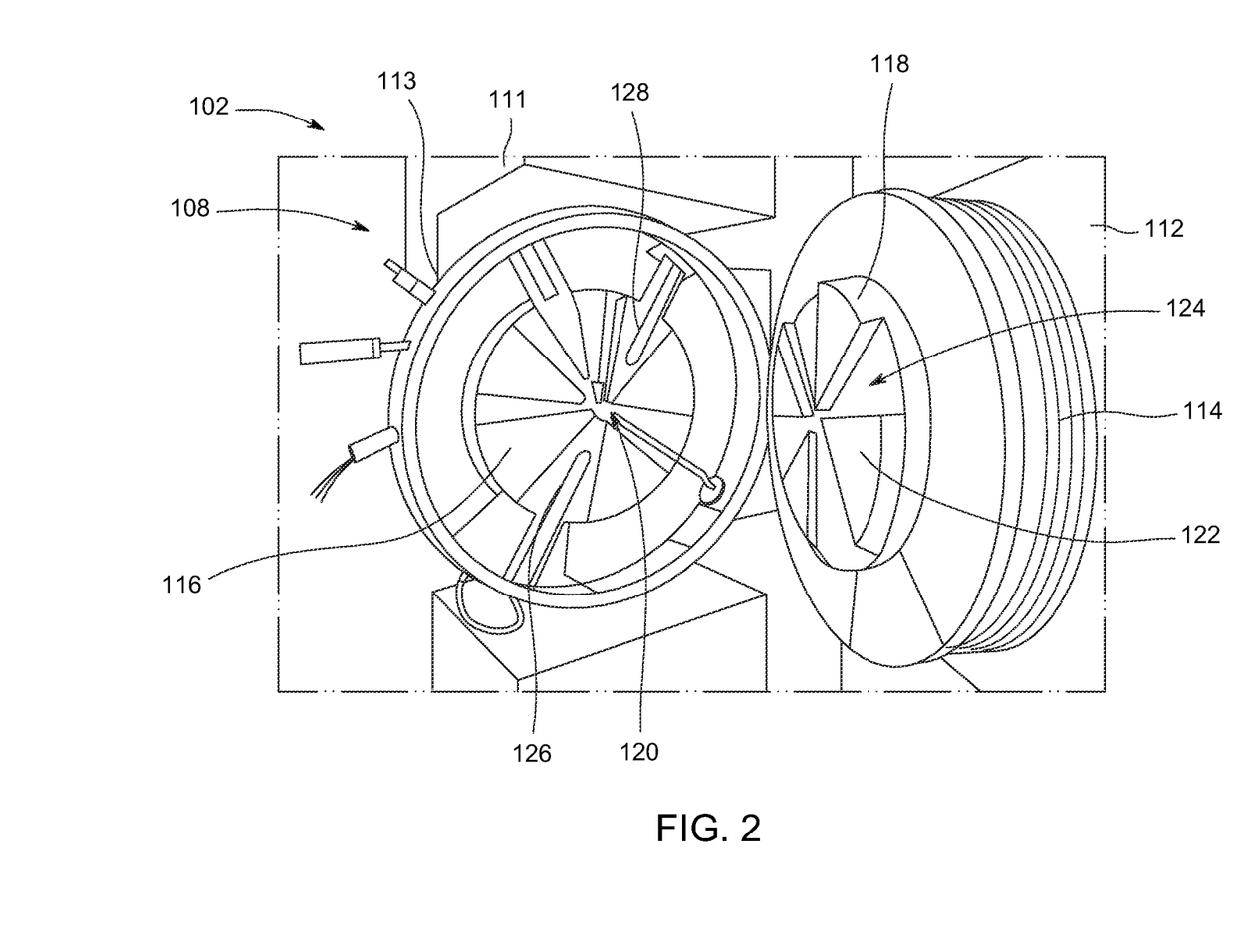
FIG. 2 illustrates a perspective view of the isotope production system of FIG. 1 having a cyclotron that is opened to illustrate components of the cyclotron.

FIG. 2 is a perspective view of a portion of the particle accelerator 102. Although the following description is with respect to the particle accelerator 102 being a cyclotron, it is understood that embodiments may include other particle accelerators and sub-systems of the same. As shown in FIG. 2, the particle accelerator 102 includes the magnet assembly 108 having the yoke sections 111, 112 and the electromagnets 113, 114. The electromagnets 113, 114 are magnet coils in the illustrated embodiment. The particle accelerator 102 may also include pole tops 116, 118. The pole top 116 is secured to the yoke section 111, and the pole top 118 is secured to the yoke section 112. As shown, the yoke section 112 is rotatably coupled to the yoke section 111. During operation, the yoke section 112 is in a closed position (as shown in FIG. 1) such that the pole tops 116, 118 oppose each other and an acceleration chamber is defined therebetween. When the particle accelerator 102 is not operating, the yoke section 112 may be opened to allow access to the acceleration chamber.

The acceleration chamber is configured to allow charged particles, such as $^1H^-$ ions, to be accelerated therein along a predetermined curved path that wraps in a spiral manner about an axis that extends between centers of the opposing pole tops 116, 118. The charged particles are initially positioned proximate to a central region 120 of the acceleration chamber. When the particle accelerator 102 is activated, the path of the charged particles may orbit around the axis that extends between the pole tops 116, 118. In particular embodiments, the pole top 118 includes hills 122 and valleys 124. The particle accelerator 102 also includes a pair of RF electrodes 126, 128 that are positioned adjacent to the pole top 116. The RF electrodes 126, 128 are sized and shaped to be received within corresponding valleys 124 of the pole top 118 when the yoke section 112 is closed.

The RF electrodes 126, 128 are configured to be energized by the RF power generator 106 (FIG. 1) to generate an electrical field. The magnetic field is provided by the yoke sections 111, 112 and the electromagnets 113, 114. When the electromagnets 113, 114 are activated, a magnetic flux may flow between the pole tops 116, 118 and through the yoke sections 111, 112 around the acceleration chamber. When the electrical field is combined with the magnetic field, the particle accelerator 102 may direct the particles along the predetermined orbit. The RF electrodes 126, 128 cooperate with each other and form a resonant system that includes inductive and capacitive elements tuned to a predetermined frequency (e.g., 100 MHz). Accordingly, the RF electrodes 126, 128 are controlled by the RF power generator 106 to accelerate the charged particles.

In particular embodiments, the system 100 uses $^1H^-$ technology and brings the charged particles (negative hydrogen ions) to a designated energy with a designated beam current. In such embodiments, the negative hydrogen ions are accelerated and guided through the particle accelerator 102. The negative hydrogen ions may then hit a stripping foil (not shown) such that a pair of electrons are removed and a positive ion, $^1H^+$ is formed. The positive ion may be directed into an extraction system (not shown). However, embodiments described herein may be applicable to other types of particle accelerators and cyclotrons. For example, in alternative embodiments, the charged particles may be positive ions, such as $^1H^+$, $^2H^+$, and $^3He^+$. In such alternative embodiments, the extraction system may include an electrostatic deflector that creates an electric field that guides the particle beam toward the target material.

The system 100 is configured to produce radioisotopes (also called radionuclides) that may be used in medical imaging, research, and therapy, but also for other applications that are not medically related, such as scientific research or analysis. When used for medical purposes, such as in Nuclear Medicine (NM) imaging or Positron Emission Tomography (PET) imaging, the radioisotopes may also be called tracers. By way of example, the system 100 may generate protons to make $^{18}F^-$ isotopes in liquid form, $^{11}C$ isotopes as $CO_2$, and $^{13}N$ isotopes as $NH_3$. The target material used to make these isotopes may be enriched $^{18}O$ water, natural $^{14}N_2$ gas, $^{16}O$-water. In some embodiments, the system 100 may also generate protons or deuterons in order to produce $^{15}O$ gases (oxygen, carbon dioxide, and carbon monoxide) and $^{15}O$ labeled water.

The system 100 may also be configured to accelerate the charged particles to a predetermined energy level. For example, some embodiments described herein accelerate the charged particles to an energy of approximately 18 MeV or less. In other embodiments, the system 100 accelerates the charged particles to an energy of approximately 16.5 MeV or less. In particular embodiments, the system 100 accelerates the charged particles to an energy of approximately 9.6 MeV or less. In more particular embodiments, the system 100 accelerates the charged particles to an energy of approximately 7.8 MeV or less. However, embodiments describe herein may also have an energy above 18 MeV. For example, embodiments may have an energy above 100 MeV, 500 MeV or more. Likewise, embodiments may utilize various beam current values. By way of example, the beam current may be between about of approximately 10-30 μA. In other embodiments, the beam current may be above 30 μA, above 50 μA, or above 70 μA. Yet in other embodiments, the beam current may be above 100 μA, above 150 μA, or above 200 μA.

Figure 3:
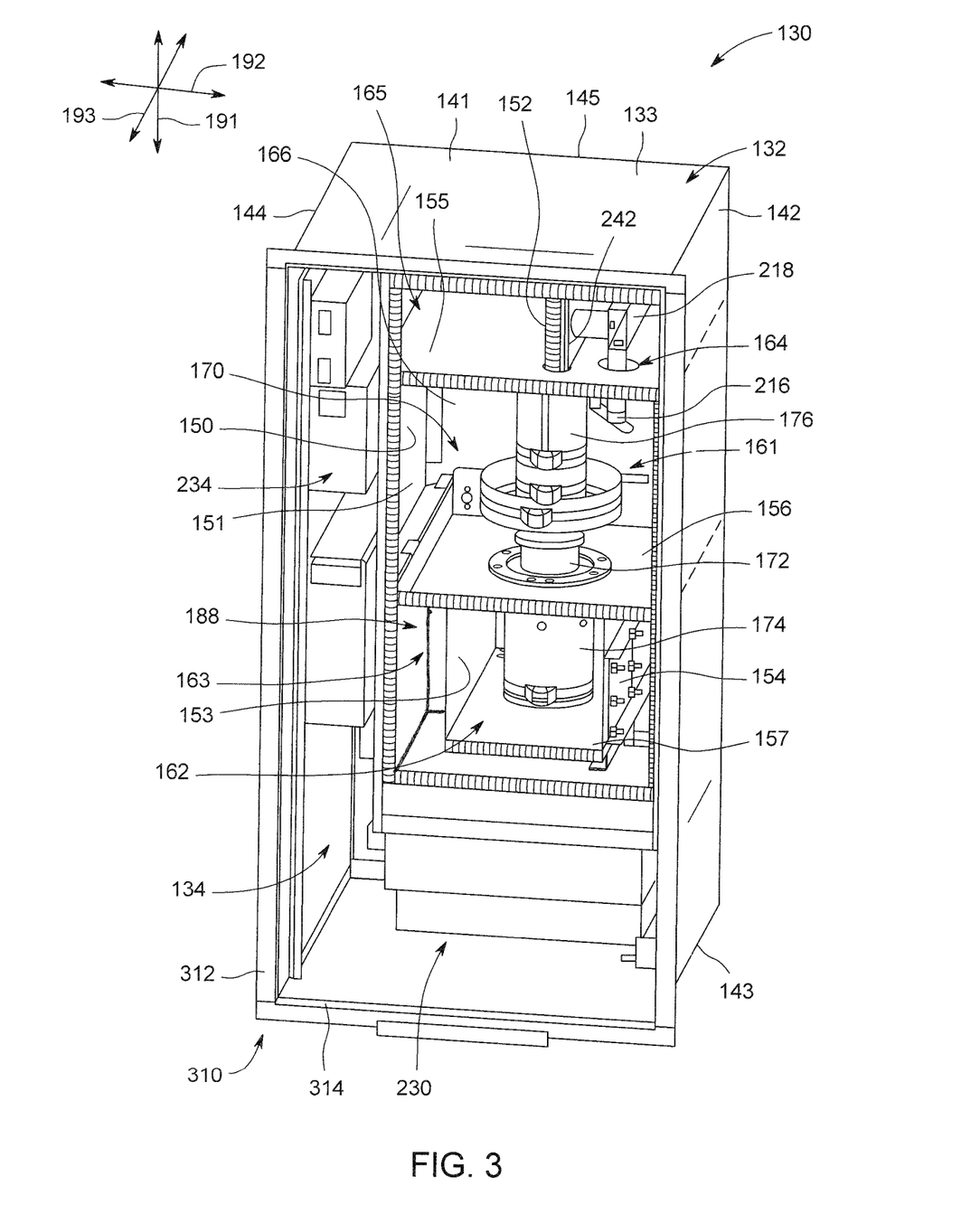
FIG. 3 is a perspective view of a radio frequency (RF) power generator having a RF amplification system in accordance with an embodiment.

FIG. 3 is a perspective view of a RF power generator 130, which may be used with an isotope production system, such as the isotope production system 100 (FIG. 1). It is contemplated, however, that the RF power generator 130 may be used in other applications that require RF power amplification. The RF power generator 130 may be similar to the RF power generator 106 (FIG. 1) and configured to energize RF electrodes, such as the RF electrodes 126, 128 (FIG. 2). The RF power generator 130 includes a generator housing 132, which may be referred to as a cabinet in some embodiments. The generator housing 132 houses a number of interconnected components of the RF power generator 130 that cooperate in generating a sufficient amount of electric power for operating the RF electrodes. The generator housing 132 includes a system cavity 134 where a number of electrical systems are located for generating electric power.

The generator housing 132 includes an outer enclosure 133 having external walls 141-145. The outer enclosure 133 includes the system cavity 134 and separates the system cavity 134 from an exterior of the RF power generator 130. For example, the external walls 141-145 may face an exterior or external environment that is readily accessible to individuals and/or that has equipment positioned adjacent to one or more of the external walls 141-145. The generator housing 132 and other internal shielding structures may be configured to obtain a designated electromagnetic compliance (EMC). More specifically, the generator housing 132 may be configured to reduce leakage of electromagnetic radiation into the exterior.

As shown, the RF power generator 130 is oriented with respect to mutually perpendicular axes, including a longitudinal axis 191, a lateral axis 192, and a depth axis 193. The lateral axis 192 extends laterally between the external walls 142, 144. The longitudinal axis 191 may be a vertical axis that extends parallel to the force of gravity, and the depth axis 193 may extend into the system cavity 134. It is contemplated that the longitudinal axis 191 in other embodiments may not extend parallel to the force of gravity.

The generator housing 132 may also include an inner enclosure 150 that is positioned within the system cavity 134. The inner enclosure 150 may include interior walls 151-158 that form a plurality of compartments 161-165. As shown, the interior walls 151-154 are vertical walls that extend parallel to a plane defined by the longitudinal and depth axes 191, 193. In the illustrated embodiment, the interior wall 151 extends along an entire height of the inner enclosure 150, which is less than a height of the outer enclosure 133. The interior walls 155-157 may be horizontal walls that extend parallel to a plane defined by the lateral axis 192 and the depth axis 193. The interior walls 151-158 may interconnect with one another to form the compartments 161-165.

The compartments 161-165 may also be partially defined by the outer enclosure 133. For example, the external wall 145 includes an interior surface 166 that may define a back end of the compartments 161-165. The external wall 142 may include an interior surface (not shown) that defines a side of the compartments 161, 162, 164.

The interior wall 156 may be referred to as the grounding deck 156, and the interior walls 155, 157 may be referred to as the shorting decks. The compartment 161 may be referred to as the power compartment (or first Power compartment). In particular embodiments, the power compartment 161 is an output cavity or anode cavity. The compartment 162 may be referred to as the power compartment (or second power compartment). In particular embodiments, the power compartment 162 is an input cavity or cathode cavity. The compartment 164 may be referred to as the port compartment. In the illustrated embodiment, the power compartment 161 and the port compartment 164 share the interior wall 155 such that the interior wall 155 separates the power and port compartments 161, 164.

The RF power generator 130 includes an RF amplification system 170 that is disposed in the system cavity 134. In the illustrated embodiment, the RF amplification system 170 is positioned within at least one of the compartments 161-165. In certain embodiments, the RF amplification system 170 includes a power tube 172 and input and output conductors 174, 176. The power tube 172 is coupled to the grounding deck 156. The RF amplification system 170 may form an input cavity resonator 178 (referenced in FIG. 4) that includes the input conductor 174 and an output cavity resonator 180 (referenced in FIG. 4) that includes the output conductor 176. The input and output conductors 174, 176 are inner conductors of the corresponding input and output cavity resonators 178, 180. The input resonator 178 may include an outer conductor 182 (referenced in FIG. 4) that is formed by the interior walls 153, 154, the external wall 145, and a movable access panel 202 (shown in FIG. 4). The outer conductor 182 surrounds the input conductor 174. The output resonator 180 may include an outer conductor 184 (referenced in FIG. 4) that is formed by the interior wall 151, the external walls 142, 145, and the movable access panel 202. The outer conductor 184 surrounds the output conductor 176.

In the illustrated embodiment, the input and output resonators 178, 180 interact with the power tube 172 to produce electric power for energizing, for example, a particle accelerator. The RF amplification system 170 may be capable of producing, for example, at least 5 kilowatts of electric power. In some embodiments, the RF amplification system 170 is capable of producing at least 8 kilowatts or at least 10 kilowatts.

During operation, the RF amplification system 170 may emit electromagnetic radiation while producing the electric power. In an exemplary embodiment, the power tube 172 is a power triode that includes a cathode, anode, and control grid (not shown). The cathode may be heated by a filament that receives current from a power supply (not shown). The heated filament causes the cathode to emit electrons, which flow through the power tube 172 toward the anode. The control grid is positioned between the cathode and anode and may be used to control the flow of the electrons. Although the power tube 172 is a power triode in some embodiments, it should be understood that other power tubes may be used, such as tetrodes or pentodes. Moreover, although the above describes one type of RF amplification system, it should be understood that other embodiments may include another type of RF amplification system.

In some embodiments, the grounding deck 156 is capable of being moved to change a size of the power compartment 161 and/or electrical performance of the output resonator 180. In particular embodiments, the RF amplification system 70 includes a movable tray assembly 188 that has a plurality of interconnected components of the RF amplification system 170. For example, the movable tray assembly 188 includes the grounding deck 156, the power tube 172, the interior walls 153, 154, 157, and the input conductor 174. The movable tray assembly 188 may allow for the components to be assembled, serviced, and/or tested outside of the generator housing 132 and then moved, as a unit, into the system cavity 134. The movable tray assembly 188 may be movable to different levels along the longitudinal axis 191. Moving the movable tray assembly 188 along the longitudinal axis 191 may effectively change a length of one or more resonators 178, 180 of the RF amplification system 170. In some embodiments, moving the movable tray assembly 188 along the longitudinal axis 191 may be referred to as coarse tuning the RF amplification system 170, The movable tray assembly is described in greater detail in U.S. application Ser. No. 14/575,993, which is incorporated herein by reference in its entirety.

The inner enclosure 150 may also include a conductive frame 190 that is configured to engage the movable access panel 202. The conductive frame 190 includes a plurality of flexible conductive elements 194 (e.g., contact springs, spring fingers, and the like) that are distributed along respective edges the interior walls 151-158. The conductive frame 190 may surround and define access openings to the respective compartments 161-165. The inner enclosure 150 may also include locking devices 196 are configured to engage the movable access panel 202 and hold the movable access panel 202 against the conductive elements 194 of the conductive frame 190.

Figure 4:
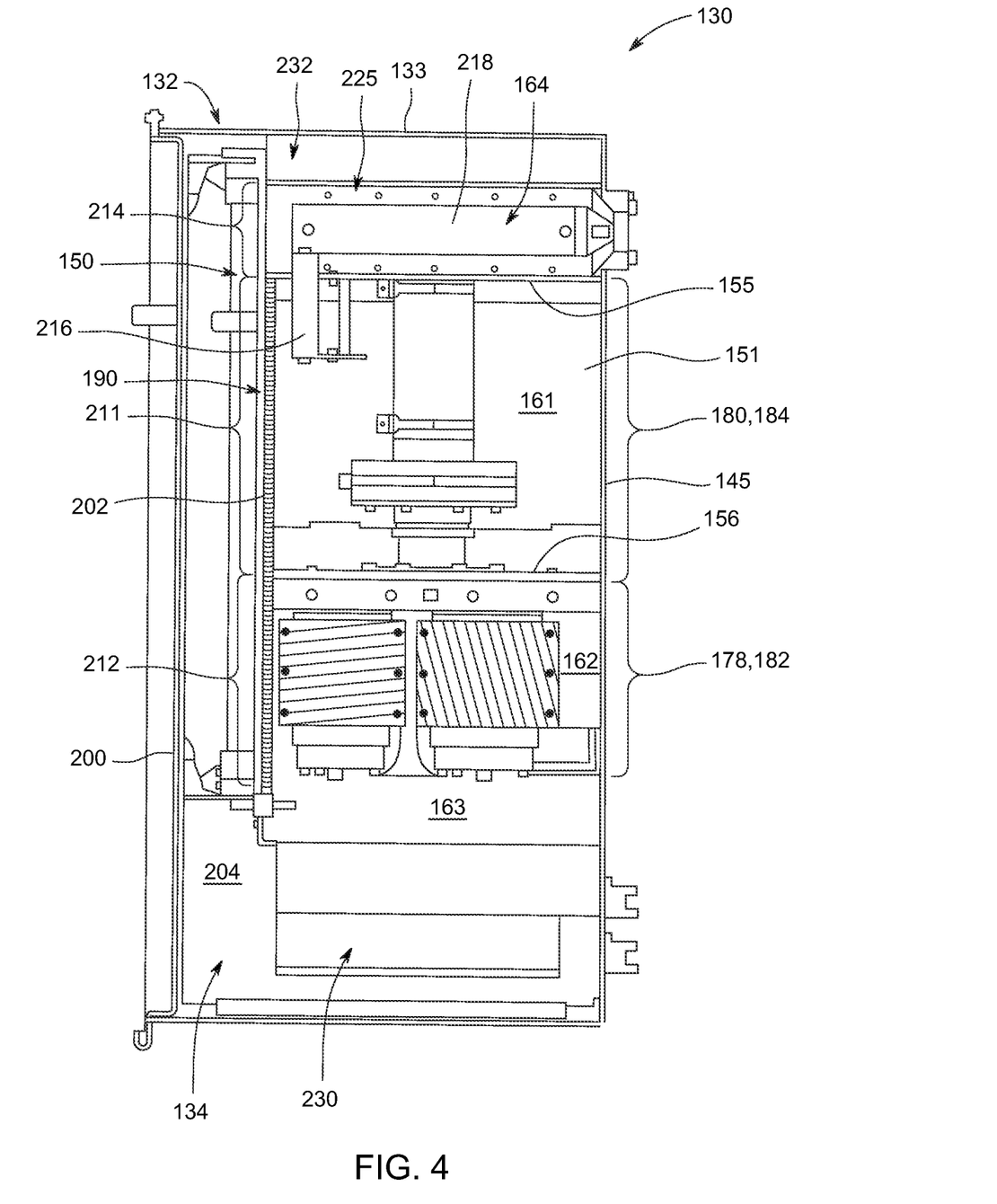
FIG. 4 is a side cross-sectional view of the RF power generator of FIG. 3.

FIG. 4 is a side cross-sectional view of the RF power generator 130 when fully assembled. As shown, the generator housing 132 includes a system door 200 and the movable access panel 202. The movable access panel 202 is positioned within the system cavity 134 and pressed against the conductive frame 190. As shown in FIG. 4, an outer space 204 exists between the inner and outer enclosures 150, 133. The outer space 204 may represent space outside of the inner enclosure 150. Collectively, the outer space 204 and the compartments 161-165 may form substantially the entire system cavity 134. (The compartment 165 (FIG. 3) is not shown in FIG. 4.)

Each of the compartments may include a corresponding access opening that opens to the outer space 204 when the movable access panel 202 is removed. For example, as shown in FIG. 4, the Power compartment 161 has an access opening 211, the power compartment 162 has an access opening 212, and the port compartment 164 has an access opening 214. The movable access panel 202 is configured to engage the interior walls 151-158 and cover the access openings 211, 212, 214. Accordingly, the inner enclosure 150 and at least a portion of the outer enclosure 133 may define a shielded inner space of the system cavity 134. The inner enclosure 150 is configured to reduce electromagnetic radiation generated therein from leaking into the system cavity 134 or, more specifically, from leaking into the outer space 204. The inner enclosure 150 may also reduce electromagnetic radiation generated therein from leaking into the exterior.

With respect to FIGS. 3 and 4, the inner enclosure 150 and the outer enclosure 133 may be configured to provide multiple shielding structures that impede leakage of the electromagnetic radiation. For example, a substantial portion of the electromagnetic radiation is generated within the power compartment 161 and within the power compartment 163. In some embodiments, walls or surfaces that define the power compartment 161 and the power compartment 162 are devoid of openings that open directly to the exterior. For example, the external wall 145 may not have any seams, apertures, feedthroughs along the power compartment 161 and the power compartment 162 that extend through the external wall 145 and open directly to the exterior. Likewise, the external wall 142 (FIG. 3) may not have seams, apertures, feedthroughs along the power compartment 161 that extend through the external wall 142 and open directly to the exterior.

During operation of the RF power generator 130, the electric power generated within the power compartment 161 is transferred by magnetic pickup loop 216 positioned within the power compartment 161 to an inner conductor 218 that is disposed within the port compartment 164. The inner conductor 218 is located within the inner enclosure 150 and may form a coaxial line 241 (shown in FIG. 5) with an outer conductor 242 formed by the inner enclosure 150. The inner conductor 218 may have a relatively short length. For example, the length of the inner conductor 218 may be between 200 mm to 500 mm. In particular embodiments, the length of the inner conductor 218 is about 250 to 350 mm. The coaxial line 241 may transmit the electric power through the port compartment 164 to a passage 260 (shown in FIG. 8) that opens to the exterior. The coaxial line 241 may engage a cable (not shown), such as the power cable 105 (FIG. 1), at the passage 260.

In certain embodiments, the coaxial line 241 may form part of a directional coupler 225 (shown in FIG. 4) that is configured to measure forward and reflected power along the coaxial line 241. The port compartment 164 may comprise the directional coupler 225. In certain embodiments, the coaxial line 241 may form part of a feedthrough assembly 240 (shown in FIG. 4) that supplies the electric power to a power cable (not shown) located in the exterior of the RF power generator 130.

Figure 5:
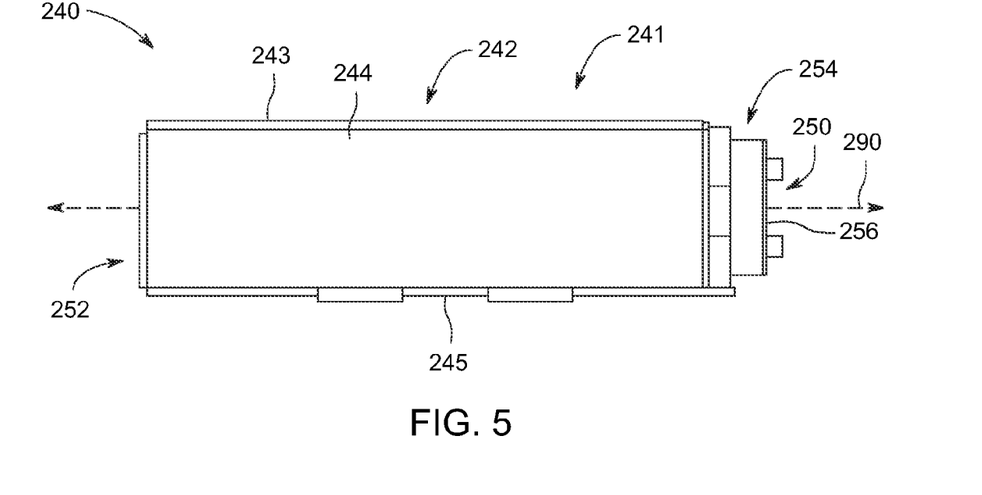
FIG. 5 is a side view of a feedthrough assembly that may be used by the RF power generator of FIG. 3.

FIG. 5 is an isolated side view of the feedthrough assembly 240. The feedthrough assembly 240 includes the coaxial line 241, which is positioned within the system cavity 134 (FIG. 3), and a connector shield 254, which is at least partially positioned in the exterior and configured to mate with the power cable (not shown). The coaxial line 241 includes an outer conductor 242 that is formed by sidewalls 243-245 and sidewall 246 (shown in FIG. 6). The outer conductor 242 forms a line cavity 248 (shown in FIG. 7) having the inner conductor 218 (FIG. 3) disposed therein. The inner and outer conductors 218, 242 extend parallel to each other along a central axis 290.

In an exemplary embodiment, the outer conductor 242 is at least partially formed by at least one of the interior walls or the external walls of the outer enclosure 133 (FIG. 3). For example, one or more of the sidewalls 243-246 may be formed by the interior walls that define the port compartment 164 (FIG. 3). More specifically, the sidewall 246 may constitute the interior wall 152 (FIG. 3) and the sidewall 245 may be a portion of the interior wall 155 (FIG. 3). In such embodiments, the line cavity 248 may constitute or be part of the port compartment 164 (FIG. 3), and the connector shield 254 may be positioned within or along the port compartment 164.

As shown, the feedthrough assembly 240 has a mating end 250 and an opposite loading end 252. The loading end 252 may include the access opening 214 in some embodiments. For example, the movable access panel 202 (FIG. 4) may form a back wall that covers the access opening 214 in some embodiments. The connector shield 254 may form the mating end 250 and be electrically coupled to the outer conductor 242. The connector shield 254 may be integrated with the outer enclosure 133 (FIG. 3) to reduce leakage of the electromagnetic radiation into the exterior. The connector shield 254 may at least partially clear the external wall 145 (FIG. 3). In alternative embodiments, the connector shield 254 may be integrated with the outer enclosure 133, but be recessed within the system cavity 134 (FIG. 3).

In an exemplary embodiment, the connector shield 254 is welded to the outer enclosure 133. In other embodiments, the connector shield 254 may be shaped from the external wall 145 or other portion of the outer enclosure 133. In FIG. 5, the connector shield 254 includes a cap 256. After the connector shield 254 is secured to the outer enclosure 133, the cap 256 may be removed to expose a passage 260 (shown in FIG. 8) formed by the connector shield 254 that opens to the exterior of the RF power generator 130. The passage 260 allows a power cable (not shown), such as the power cable 105 (FIG. 1), to electrically couple to the inner conductor 218.

Figure 6:
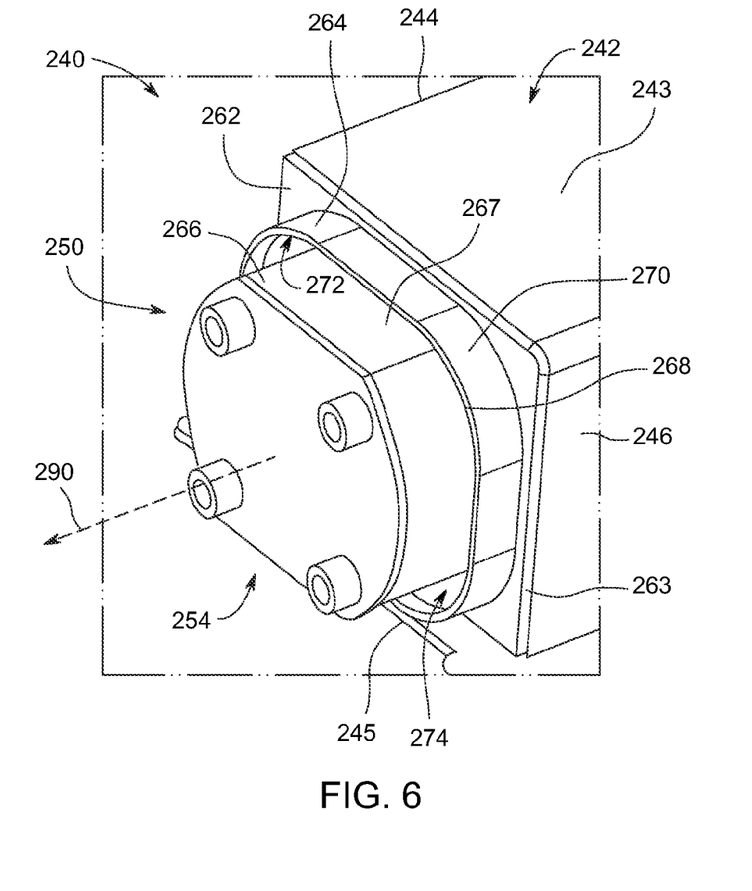
FIG. 6 illustrates a mating end of the feedthrough assembly of FIG. 5 that includes a capped connector shield.

FIG. 6 is an enlarged perspective view of the mating end 250 of the feedthrough assembly 240. In the illustrated embodiment, the connector shield 254 includes a panel platform 262, a securing wall 264, and a mating head 266. In some embodiments, the connector shield 254 is a separate or discrete part that is mechanically and electrically coupled to the outer conductor 242. For example, in some embodiments, the panel platform 262 has a platform edge 263 that is welded to corresponding edges of the outer conductor 242. Optionally, the connector shield 254 and/or the panel platform 262 may be formed from one of the sidewalls 243-246 and folded over to align with the line cavity 248 (FIG. 7).

The mating head 266 and the securing wall 264 are coupled to the panel platform 262 and project away from the panel platform 262 along the central axis 290. The mating head 266 is configured to engage the power cable. The cap 256 is coupled to the mating head 266 in FIG. 6. In the illustrated embodiment, the mating head 266 includes an oval-shaped body that projects away from the outer conductor 242. However, the mating head 266 may have other shapes in alternative embodiments. The mating head 266 includes an outer surface 267 that faces generally away from the central axis 290.

In the illustrated embodiment, the securing wall 264 may be referred to as a flange. The securing wall 264 surrounds the mating head 266 about the central axis 290. The securing wall 264 includes a leading edge 268 and an outer surface 270 that faces generally away from the central axis 290. The securing wall 264 also includes an inner surface 272 that faces generally toward the central axis 290. In the illustrated embodiment, the inner surface 272 of the securing wall 264 opposes the outer surface 267 of the mating head 262 with a gap 274 therebetween. As described below, the leading edge 268 and/or the outer surface 270 may be welded to the outer enclosure 133 (FIG. 3). The gap 274 may separate the mating head 266 from the securing wall 264 to protect the mating head 266 during the welding process.

Figure 7:
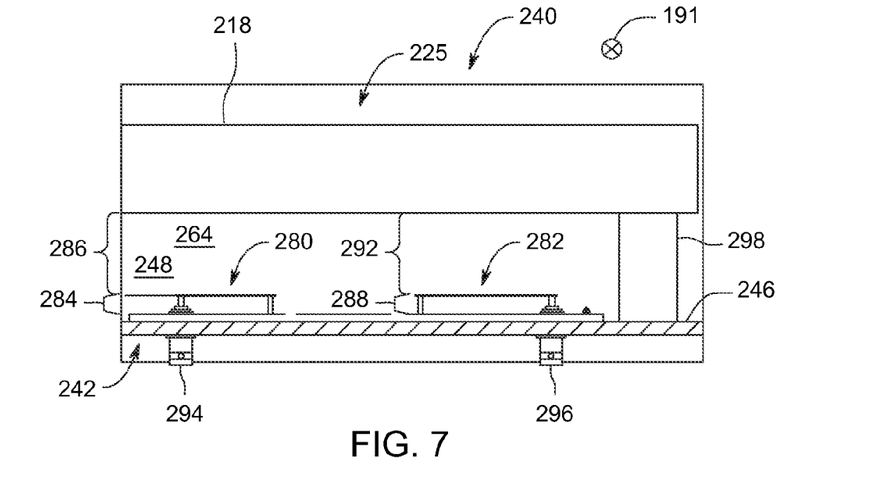
FIG. 7 is a plan view of a cross-section of a portion of a directional coupler that is formed by the coaxial line of FIG. 5.

FIG. 7 is a cross-section of a portion of the coaxial line 241 viewed along the longitudinal axis 191. In some embodiment, the coaxial line 241 may form part of the directional coupler 225 such that the direction coupler 225 is disposed within the system cavity 134 (FIG. 3). In other embodiments, the coaxial line 241 through the port compartment 164 does not form a directional coupler. In such embodiments, a directional coupler may be used, for example, outside of the RF power generator 130 (FIG. 3).

FIG. 7 illustrates the sidewall 246 and the inner conductor 218 within the line cavity 248. The line cavity 248 may constitute the port compartment 164 shown in FIG. 3. The inner conductor 218 is centrally positioned within the line cavity 248 and extends parallel to the outer conductor 242. Also shown, the directional coupler 225 may include first and second pickup elements 280, 282. In the illustrated embodiment, the pickup elements 280, 282 comprise plates that extend parallel to the inner conductor 218 and the outer conductor 242 for different respective lengths. The pickup element 280 is spaced apart from the sidewall 246 by a designated distance 284 and spaced apart from the inner conductor 218 by a designated distance 286. Likewise, the pickup element 282 is spaced apart from the sidewall 246 by a designated distance 288 and spaced apart from the inner conductor 218 by a designated distance 292. The designated distances 284 and 288 are less than the designated distances 286 and 292, respectively. In an exemplary embodiment, the designated distance 284 is less than the designated distance 286.

The inner conductor 218, the outer conductor 242, and the pickup elements 280, 282 form the directional coupler 225 that disposed within the system cavity 134. The pickup elements 280, 282 are positioned relative to the inner conductor 218 and outer conductor 242 and configured to measure forward and reflected power along the coaxial line 241. For example, as the electric power is transmitted through the inner conductor 218, signals may be radiated by the forward power and the reflected power. These signals may be electrically coupled to the pickup elements 280, 282 (i.e., detected or sensed) and communicated through communication lines 294, 296, respectively. To this end, the designated distances 284, 286, 288, and 292 are configured to achieve a desired performance. The communication lines 294, 296 may be coupled to, for example, a control system (not shown) that monitors the performance of the RF power generator 130.

Also shown in FIG. 7, a mounting spacer 298 may be mounted to the sidewall 246 and coupled to the inner conductor 218 within the line cavity 248. The mounting spacer 298 may be an insulative or dielectric material that is configured to hold the inner conductor 218 at a designated position within the line cavity 248 (or port compartment 164) relative to the outer conductor 242. The inner conductor 218 may also be positioned to align with the passage 260 (FIG. 8) for connecting to the external cable.

Figure 8:
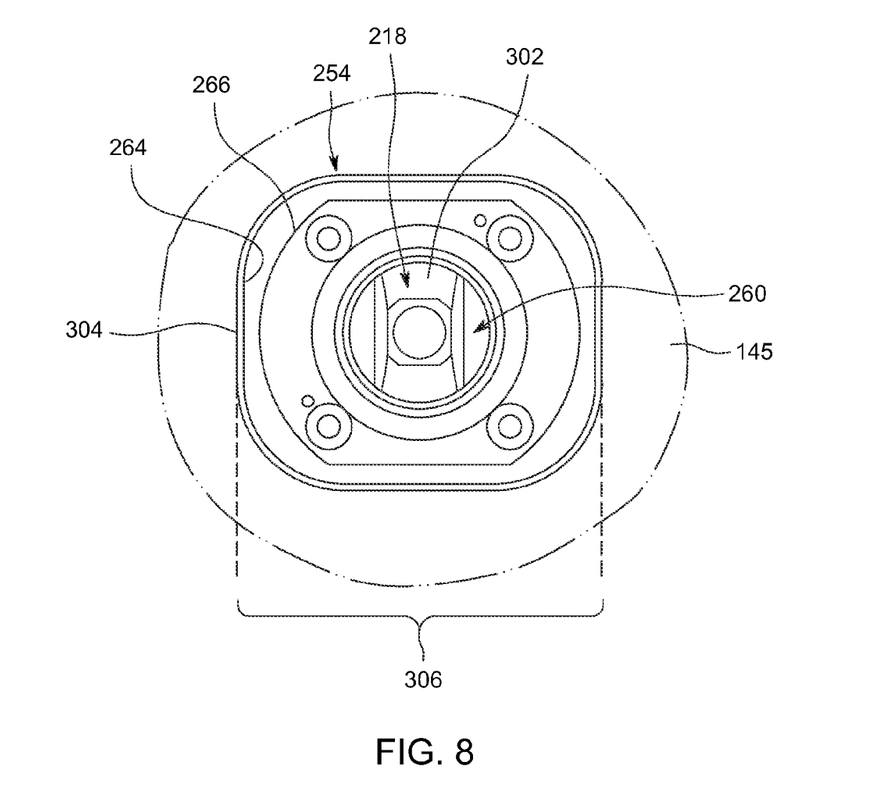
FIG. 8 is a rear view of a portion of the RF power generator of FIG. 3 illustrating an end view of the connector shield.
Figure 9:
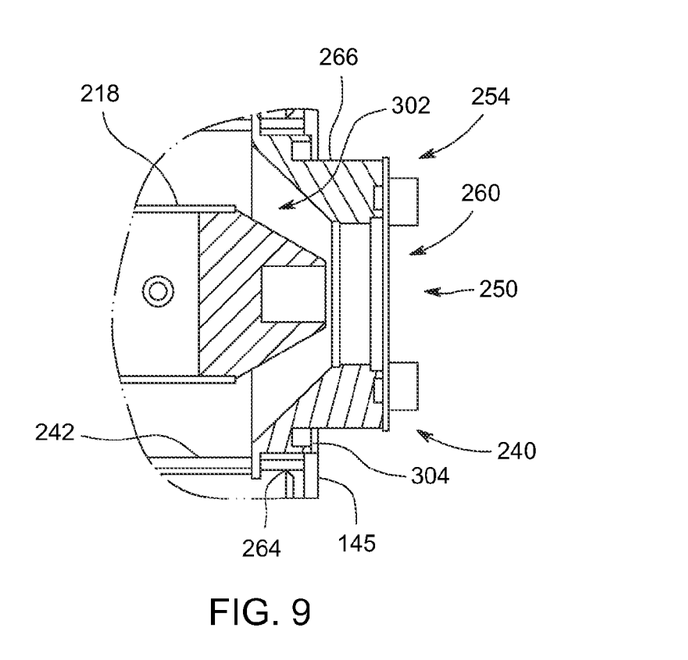
FIG. 9 is a side cross-section of the coaxial line of FIG. 5.

FIG. 8 is a rear view of a portion of the RF power generator 130 (FIG. 3) and, in particular, the external wall 145. FIG. 9 is a cross-section of the mating end 250 of the feedthrough assembly 240 and illustrates the connector shield 254 in greater detail. As shown, the passage 260 is aligned with a mating end 302 of the inner conductor 218. The mating end 302 may be shaped to engage a corresponding component of the power cable. For example, the mating end 302 has a conical shape in FIGS. 8 and 9. Likewise, the mating head 266 may be shaped to couple to a corresponding component of the power cable. In the illustrated embodiment, the mating head 266 clears the external wall 145.

As set forth herein, the connector shield 254 may be integrated with the outer enclosure 133 in some embodiments. For example, in an exemplary embodiment, the connector shield 254 is welded to a wall edge 304 of the external wall 145. The wall edge 304 may define a shield hole 306 (FIG. 8) that is sized and shaped to receive a portion of the connector shield 254. In some embodiments, the connector shield 254 may be coupled to the outer conductor 242 (FIG. 9) before the connector shield 254 is coupled to the external wall 145. As such, the inner conductor 218 may be aligned with the passage 260 formed by the connector shield 254. The connector shield 254 may then be positioned for welding to the external wall 145.

During the welding process, the conductive material of the securing wall 264 of the connector shield 254 is melted and the conductive material of the external wall 145 along the wall edge 304 is melted. More specifically, the leading edge 268 and/or the outer surface 270 of the securing wall 264 may be melted. The gap 274 may separate the mating head 266 from the thermal energy during the welding process. More specifically, the gap 274 may reduce the likelihood of the mating head 266 inadvertently melting and thereby changing shape. As such, the size of the gap 274 may be configured based on an amount of heat applied during the welding process.

The melted conductive materials coalesce and, when allowed to cool or cure, the conductive materials effectively unite or fuse together into a single piece of conductive material. As described above, the connector shield 254 may also be welded to the outer conductor 242. Accordingly, the connector shield 254 and the outer conductor 242 may be integrated with the external wall 145 of the outer enclosure 133 (FIG. 3). In such embodiments, the connector shield 254 and the external wall 145 may more effectively reduce leakage of electromagnetic radiation than conventional systems that have seams.

In other embodiments, the connector shield 254 may be integrated with the outer enclosure 133 in other manners. For example, the connector shield 254 and the external wall 145 may be formed from a common piece of conductive material. In such embodiments, the connector shield 254 is also integrated with the external wall 145. However, it should be understood that the integrated connector shield 254 is not required for all embodiments. For example, in some embodiments, the connector shield 254 may form an interference fit with the external wall 145 or may be coupled to the external wall 145 using a fastening mechanism an adhesive.

Figure 10:
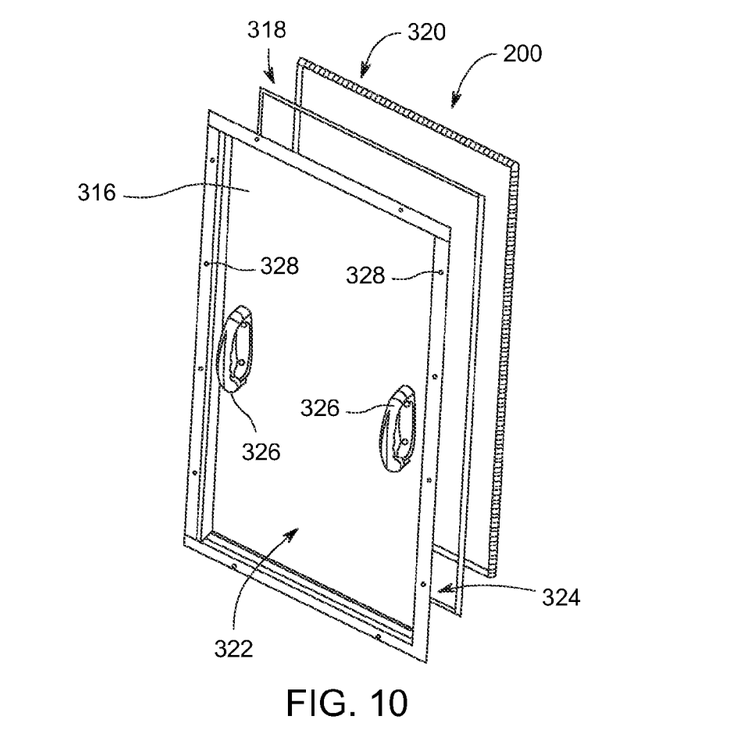
FIG. 10 is an exploded view of a system door that may be used by the RF power generator of FIG. 3.

FIG. 10 is an exploded view of the system door 200 in accordance with one embodiment. Returning briefly to FIG. 3, the system door 200 is configured to engage the outer enclosure 133 to enclose the elements of the RF power generator 130 within the system cavity 134. To this end, the outer enclosure 133 includes a door frame 310 having a forward-facing surface 312 and an inner surface 314 that is counter-sunk. The forward-facing surface 312 and the inner surface 314 are perpendicular to each other.

With respect to FIG. 10, the system door 200 may include a door body 316 and first and second conductive gaskets 318, 320. The door body 316 has an exterior side 322 and an interior side 324. The system door 200 also includes a pair of handles 326 that are coupled to the exterior side 322. As shown, the door body 316 may include fastener holes 328 along an outer perimeter of the door body 316. When the system door 200 is secured to the outer enclosure 133 (FIG. 3), fasteners (e.g., screws) may extend through the fastener holes 328 and engage the outer enclosure 133.

Figure 11:
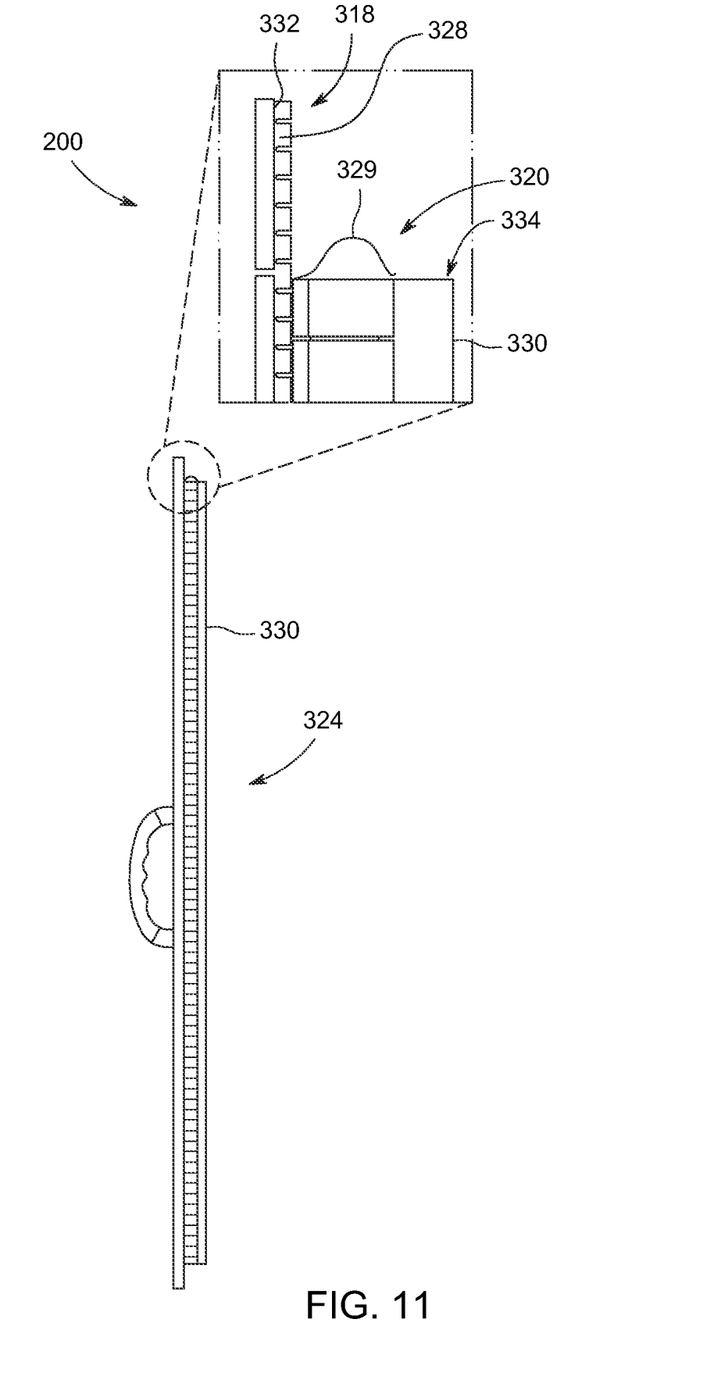
FIG. 11 is a side view of the system door that may be used by the RF power generator of FIG. 3.

FIG. 11 is a side view of the system door 200. The first and second conductive gaskets 318, 320 are positioned along the interior side 324 and surround a platform portion 330 of the door body 316. The platform portion 330 may extend through openings of the first and second conductive gaskets 318, 320 and extend beyond the first and second conductive gaskets 318, 320. As shown in the enlarged view of FIG. 11, the first conductive gasket 318 is coupled directly against a flange 332 of the system door 200 that is coupled to the platform portion 330 and projects away therefrom. The second conductive gasket 320 is coupled directly to a platform surface 334 of the platform portion 330. The flange 332 is configured to interface with the forward-facing surface 312 (FIG. 3) of the door frame 310 with the first conductive gasket 318 therebetween. The platform surface 334 is configured to interface with the inner surface 314 (FIG. 3) of the door frame 310 with the second conductive gasket 320 therebetween.

The first and second conductive gaskets 318, 320 include respective flexible conductive elements 328, 329. The conductive elements 328, 329 may be, for example, contact springs, spring fingers, and the like. The conductive elements 328 are configured to be deflected toward the flange 332, and the conductive elements 329 are configured to be deflected toward the platform surface 334. The conductive elements 328, 329 may be tightly distributed along the flange 332 and the platform surface 334, respectively. Accordingly, a seam formed between the system door 200 and the outer enclosure 133 may be electromagnetically sealed to reduce the leakage of the electromagnetic radiation. In some embodiments, the sizes and/or center-to-center spacings of the conductive elements 328, 329 may be different to reduce the likelihood of unwanted gaps forming.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f) unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, or the like). Similarly, the programs may be stand alone programs, may be incorporated as subroutines in an operating system, may be functions in an installed software package, or the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A radio frequency (RF) power generator comprising:
   an outer enclosure having a system cavity, the outer enclosure separating the system cavity from an exterior of the RF power generator;
   an RF amplification system disposed in the system cavity and emitting electromagnetic radiation while producing electric power for energizing a particle accelerator, the outer enclosure being configured to reduce leakage of the electromagnetic radiation into the exterior; and
   a feedthrough assembly comprising a coaxial line configured to receive the electric power generated by the RF amplification system, the coaxial line being positioned within the system cavity and having inner and outer conductors, the feedthrough assembly including a connector shield that forms a passage to the exterior of the RF power generator, the connector shield being electrically coupled to the outer conductor of the coaxial line and integrated with the outer enclosure to reduce leakage of the electromagnetic radiation into the exterior.

2. The RF power generator of claim 1, wherein the connector shield is welded to the outer enclosure.

3. The RF power generator of claim 1, wherein the connector shield includes a mating head that defines the passage and is configured to engage the external cable, the connector shield including a securing wall that surrounds the mating head and is spaced apart from the mating head, the securing wall being welded to the outer enclosure.

4. The RF power generator of claim 1, further comprising a directional coupler disposed within the system cavity, the directional coupler including the inner conductor and the outer conductor of the coaxial line and pickup elements for measuring forward and reflected power along the coaxial line.

5. The RF power generator of claim 1, further comprising an inner enclosure positioned within the system cavity and surrounding the RF amplification system, the outer enclosure and the inner enclosure defining an outer space therebetween, the inner enclosure configured to reduce electromagnetic radiation generated therein from leaking into the system cavity, the inner conductor being positioned within the inner enclosure.

6. The RF power generator of claim 1, further comprising an inner enclosure positioned within the system cavity, the inner enclosure including interior walls that define a power compartment and a port compartment, the power compartment having the electric power generated therein, wherein the inner conductor is positioned within the port compartment and the interior walls that define the port compartment are a portion of the outer conductor of the coaxial line.

7. The RF power generator of claim 1, wherein the RF amplification system is configured to produce at least 5 kilowatts.

8. A radio frequency (RF) power generator comprising:
   an outer enclosure having a system cavity, the outer enclosure separating the system cavity from an exterior of the RF power generator;
   an RF amplification system disposed in the system cavity and emitting electromagnetic radiation while producing electric power for energizing a particle accelerator, the outer enclosure being configured to reduce leakage of the electromagnetic radiation into the exterior; and
   an inner enclosure positioned within the system cavity, the system cavity including an outer space that exists between the inner and outer enclosures, the inner enclosure including interior walls that form a plurality of compartments having respective access openings that open to the outer space, the inner enclosure including a movable access panel that is configured to engage the interior walls and cover the access openings, the RF amplification system being located within at least one of the compartments, the inner enclosure being configured to reduce leakage of the electromagnetic radiation into the outer space and the exterior.

9. The RF power generator of claim 8, wherein the compartments include a power compartment and a port compartment that is separated from the power compartment by at least one of the interior walls, the electric power for energizing the particle accelerator being generated within the power compartment, wherein the RF power generator includes a coaxial line that transmits the electric power through the port compartment to a passage that opens to the exterior.

10. The RF power generator of claim 9, wherein the power compartment is devoid of openings that open directly to the exterior.

11. The RF power generator of claim 9, further comprising a connector shield positioned within or along the port compartment and forming the passage to the exterior, the connector shield being welded to the outer enclosure.

12. The RF power generator of claim 9, wherein the port compartment comprises a directional coupler that measures forward and reflected power along the coaxial line.

13. The RF power generator of claim 12, further comprising a connector shield positioned within or along the port compartment and forming the passage to the exterior, the connector shield being welded to the outer enclosure and electrically coupled to an outer conductor of the directional coupler.

14. The RF power generator of claim 9, wherein the interior walls include a grounding deck that is capable of being moved to change sizes of the compartments that are partially defined by the grounding deck, the RF amplification system including a power tube that is coupled to the grounding deck.

15. The RF power generator of claim 9, further comprising a conductive frame that engages the movable access panel, the conductive frame including a plurality of flexible conductive elements that are distributed therealong.

16. A radio frequency (RF) power generator comprising:
an outer enclosure having a system cavity, the outer enclosure separating the system cavity from an exterior of the RF power generator;
an RF amplification system disposed in the system cavity and emitting electromagnetic radiation while producing electric power for energizing a particle accelerator, the outer enclosure being configured to reduce leakage of the electromagnetic radiation into the exterior; and
a plurality of interior walls positioned within the system cavity forming a power compartment and a port compartment, the electric power being produced within the power compartment, the port compartment including an inner conductor therein that receives the electric power;
wherein an outer conductor is at least partially formed by at least one of the interior walls, the RF power generator further comprising pickup elements positioned relative to the inner conductor within the port compartment, wherein the inner conductor, the outer conductor, and the pickup elements form a directional coupler disposed within the system cavity of the outer enclosure that measures forward and reflected power.

17. The RF power generator of claim 16, further comprising a connector shield positioned within or along the port compartment and forming a passage through the outer enclosure to the exterior, the connector shield being electrically coupled to the outer conductor.

18. The RF power generator of claim 17, wherein the connector shield is welded to the outer enclosure.

19. The RF power generator of claim 16, further comprising at least one dielectric mounting spacer that holds the inner conductor at a designated position within the port compartment.

20. The RF power generator of claim 16, wherein the power compartment and the port compartment share at least one of the interior walls.

* * * * *